(12) United States Patent
Farber et al.

(10) Patent No.: US 7,735,177 B1
(45) Date of Patent: Jun. 15, 2010

(54) BRUSH CORE ASSEMBLY

(75) Inventors: Jeffrey J. Farber, Delmar, NY (US);
Christopher Pena, Hayward, CA (US);
Edward Orbeta, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1156 days.

(21) Appl. No.: 11/351,567

(22) Filed: Feb. 10, 2006

(51) Int. Cl.
*H01L 21/00* (2006.01)
(52) U.S. Cl. .................................. 15/102; 15/88.3
(58) Field of Classification Search .................... 15/179, 15/23, 71–73, 88.2–88.4, 102, 198, 230; 492/28, 30–34, 36; 134/1, 22 R, 64 R, 902
See application file for complete search history.

(56) References Cited

U.S. PATENT DOCUMENTS

| | | | | |
|---|---|---|---|---|
| 5,875,507 A | * | 3/1999 | Stephens et al. | 15/102 |
| 5,933,902 A | * | 8/1999 | Frey | 15/102 |
| 6,308,369 B1 | * | 10/2001 | Garcia et al. | 15/230 |
| 6,467,120 B1 | * | 10/2002 | Ziemins et al. | 15/102 |
| 6,543,084 B2 | * | 4/2003 | Dickey et al. | 15/179 |
| 6,851,151 B1 | * | 2/2005 | Pena | 15/77 |

* cited by examiner

*Primary Examiner*—Dung Van Nguyen
(74) *Attorney, Agent, or Firm*—Martine Penilla & Gencarella, LLP

(57) ABSTRACT

A brush core for use in cleaning a substrate is provided. The brush core includes an elongated cylinder having a first end and a second end. The first end of the elongated cylinder is configured to receive a drive hub. The second end is configured to receive fluid into an inner cavity of the elongated cylinder. The inner cavity is configured to distribute fluid to a plurality of fluid channels having a first diameter. The plurality of fluid channels are configured to distribute the fluid to corresponding distribution holes having a second diameter. The brush core further including a plurality of non-fluid distributing pockets defined on the outer surface. The corresponding distribution holes and plurality of non-fluid distributing pockets are configured so that a thickness of a solid portion of the brush core is substantially similar. In one embodiment, the first diameter is less than the second diameter.

18 Claims, 5 Drawing Sheets

BRUSH CORE ASSEMBLY

BACKGROUND

As is well known, semiconductor devices are fabricated from semiconductor wafers, which are subjected to numerous processing operations. These operations include, for example, impurity implants, gate oxide generation, intermetal oxide depositions, metallization depositions, photolithography patterning, etching operations, chemical mechanical polishing (CMP), etc. Although these processes are performed in ultra clean environments, the very nature of many of the process operations is to blame for the generation of surface particles and residues. For instance, when CMP operations are performed, a film of particles and/or metal contaminants are commonly left behind.

Because surface particles can detrimentally impact the performance of an integrated circuit device, wafer cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs employ cleaning systems. The cleaning systems typically include one or more brush boxes in which wafers are scrubbed. Exemplary brush boxes include a pair of brushes, such that each brush scrubs a respective side of a wafer. To enhance the cleaning ability of such brush boxes, it is common practice to deliver cleaning fluids through the brush (TTB). TTB fluid delivery is accomplished by implementing brush cores that have a plurality of holes that allow fluids being fed into the brush core at a particular pressure to be delivered to a brush disposed over the brush core.

As semiconductor design and performance requirements continue to increase, cleaning engineers are also challenged to improve their associated processes. Continued focus has been directed toward ensuring that the consumables used during the cleaning process are uniform. In addition, efforts have been directed to ensuring that fluid distribution is uniformly delivered with the TTB delivery scheme.

In view of the foregoing, there is a need for an improved brush core design and corresponding assembly configured to provide for uniform delivery of fluid to a substrate and a brush core assembly flexible in adjusting to a substrate surface to be cleaned.

SUMMARY OF THE INVENTION

Broadly speaking, the present invention fills these needs by providing an apparatus and device for enhancing the cleaning of a substrate. It should be appreciated that the present invention can be implemented in numerous ways, including as an apparatus, a system, a device, or a method. Several inventive embodiments of the present invention are described below.

In one embodiment, a brush core assembly is provided. The brush core assembly includes a drive shaft configured to rotate about an axis. The brush core assembly further includes a first arm extension coupled to an end of the drive shaft and a second arm extension coupled to the drive shaft. The brush core assembly includes a brush core having a first end and a second end, where the first end is coupled to the first arm extension. The second end of the brush core is coupled to the second arm extension. The brush core includes a fluid plenum defined inside the brush core. The fluid plenum is configured to distribute fluid to a plurality of fluid channels, where the plurality of fluid channels are further configured to distribute the fluid to corresponding distribution holes. The corresponding distribution holes along with pockets defined on an outer surface of the brush core are configured so that a thickness of a solid portion of the brush core in between each of the corresponding distribution holes and pockets is substantially similar. In one embodiment, the brush core is created from a mold.

In another embodiment, a brush core for use in cleaning a substrate is provided. The brush core includes an elongated cylinder having a first end and a second end. The first end of the elongated cylinder is configured to receive a drive hub. The second end is configured to receive fluid into an inner cavity of the elongated cylinder. The inner cavity is configured to distribute fluid to a plurality of fluid channels having a first diameter. The plurality of fluid channels are further configured to distribute the fluid to corresponding distribution holes having a second diameter. The brush core further includes a plurality of non-fluid distributing pockets defined on the outer surface. The corresponding distribution holes and plurality of non-fluid distributing pockets being configured so that a thickness of a solid portion of the brush core is substantially similar, wherein the first diameter is less than the second diameter.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for a method and apparatus for a core design optimized for cleaning a substrate. It will be obvious, however, to one skilled in the art, that the present invention may be practiced without some or all of these specific details. In other instances, well known process operations have not been described in detail in order not to obscure the present invention.

The embodiments of the present invention provide a brush core and brush core assembly configured to more efficiently clean a substrate. Through the embodiments described herein, the brush core assembly provides for angular and lateral adjustment for the brush core and any brush disposed there over. Additionally, the hub drive translating the rotation of a drive shaft and adjustable support arm drive, provides optimal torque and axial rotation for the brush core. In one embodiment, the brush core is optimized for fluid delivery to a brush and subsequent delivery to a surface of a substrate being cleaned by the brush. The optimization of the core includes having delivery channels of successively large diameters when moving from a fluid delivery inlet of the brush core to a drive end of the brush core. In another embodiment, the brush core is capable of being created from a mold. In this embodiment, the brush core has a substantially similar wall thickness between delivery holes and non-fluid delivery pockets defined on an outer surface of the brush core. As used herein, the terms "Core" and "brush core" are interchangeable.

Figure 1:
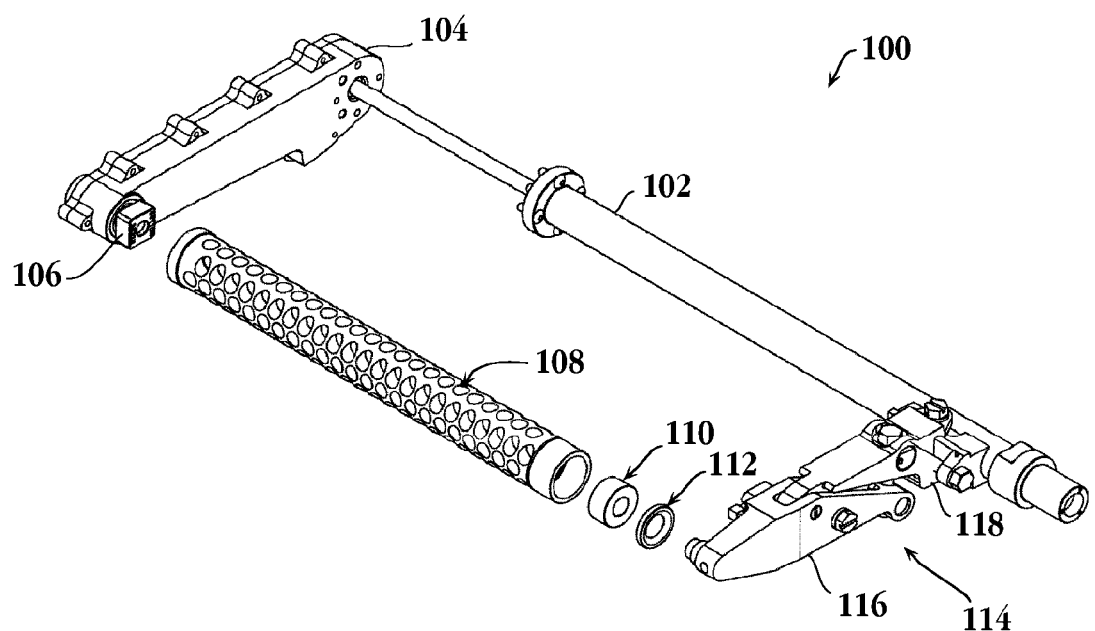
FIG. 1 is a simplified schematic diagram showing a perspective view of a brush core assembly in accordance with one embodiment of the invention.

FIG. 1 is a simplified schematic diagram showing a perspective view of a brush core assembly in accordance with one embodiment of the invention. Main pivot shaft 102 couples to brush rotate arm housing 104. Main pivot shaft 102 provides the drive in order to rotate brush core 108 of brush core assembly 100, as will be further illustrated with regard to FIG. 2. Brush rotate arm housing 104 houses a drive, which couples main pivot shaft 102 and brush core 108, e.g., through a chain, belt, etc. Brush rotate arm housing 104 includes a hub drive 106, which couples to one end of brush core 108. As illustrated, hub drive 106 is square and will be received by brush core 108 through a square receiving inlet within the end of brush core 108. One skilled in the art will appreciate that while a square hub drive is illustrated for hub drive 106, any suitable shape may be used besides a square including a circular shape in conjunction with a pin to provide engagement for the rotation. In another embodiment, octagonal, hexagonal, etc. shapes may also be used to provide the rotation for brush core 108 and translate axially to transmit torque from the hub drive to the brush core. Brush core 108 also includes a number of holes defined thereon. As illustrated with reference to FIG. 5, some of the holes on the brush core deliver fluid to a brush disposed over the brush core, while other holes do not deliver fluid. In one embodiment, brush core 108 is an elongated cylinder having a cavity defined within the cylinder, which acts as a fluid plenum. As will be seen with more detail with respect to FIG. 2, brush core 108 includes fluid channels delivering fluid to the fluid delivery holes on the outer surface of brush core 108.

Still referring to FIG. 1, the non-driven end of brush core 108 is coupled to adjustable support arm 114 through bearing 110 and seal 112. Adjustable support arm 114 includes a first section 118 and a second section 116. First section 118 provides lateral adjustment so that adjustable support arm 114 may move in a direction parallel to the brush core axis. Second section 116 provides angular adjustment. In this embodiment, second section 116 is pivotably mounted with first section 118 to provide the angular adjustment. It should be appreciated that when cleaning a semiconductor substrate, brush core assembly 100 may be brought down proximate to a surface of the substrate to be scrubbed and through angular adjustment provided by second section 116 of adjustable support arm 114, the brush core, with a brush slideably mounted thereon, may be made to be parallel to the surface of the substrate. Lateral adjustment provided by first section 118 of adjustable support arm 114 provides the necessary adjustment in order to center the brush on the wafer. Adjustable support arm 114 also includes a fluid delivery line, which delivers fluid to brush core 108. As mentioned previously, brush core 108 is configured so that a brush may be slideably mounted over the outer surface of brush core 108 and the brush will be used to scrub a surface of a semiconductor substrate or some other suitable substrate requiring cleaning such as a flat panel display. Brush core 108 in one embodiment is a molded brush core. The materials of which brush core 108 is made from include any suitable materials for molding and materials that can withstand the chemistries used for cleaning the particular application such as semiconductor substrate cleaning and flat panel glass display cleaning. Exemplary suitable materials include polypropylene, Polyvinylidene Fluoride (also known as KYNAR™) polyetheretherketone (also known as PEEK™), polyethylene terephthalate (PET), Perfluoroalkoxyethylene (PFA), and other suitable chemically resistant polymers, etc.

Figure 2:
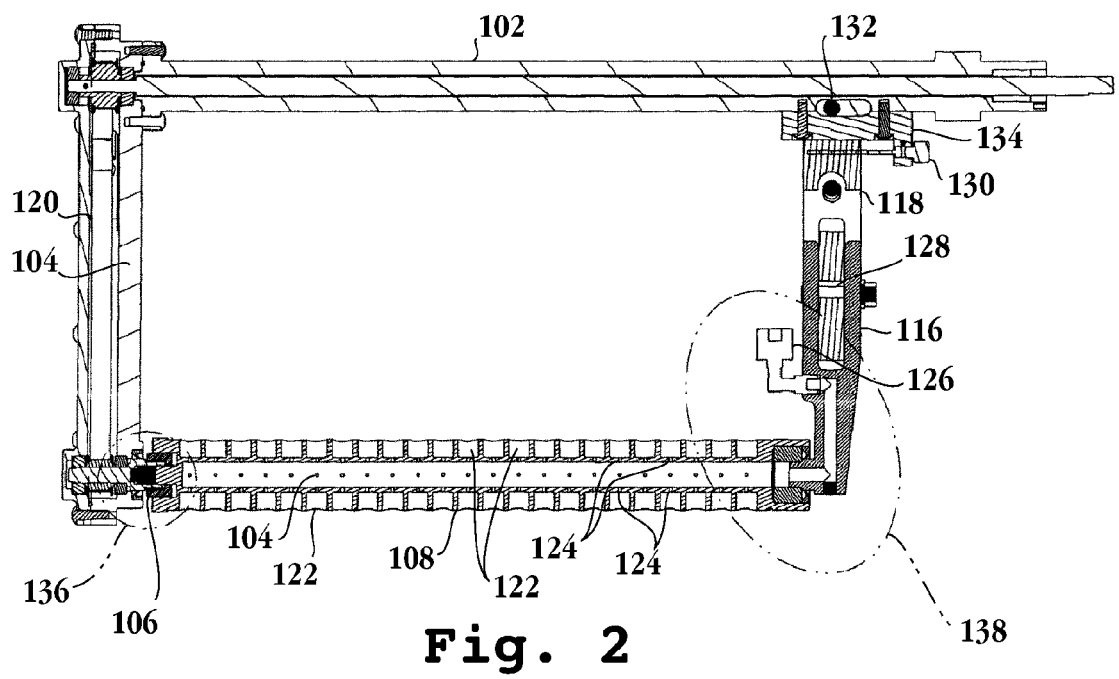
FIG. 2 is a more detailed cross-section view of the brush core assembly in accordance with one embodiment of the invention.

FIG. 2 is a more detailed cross-section view of the brush core assembly in accordance with one embodiment of the invention. Brush core assembly 100 utilizes drive shaft 102 in order to provide rotation, which is translated through brush rotate arm housing 104 in order to eventually rotate brush core 108. As illustrated in FIG. 2, belt 120 translates the rotation of drive shaft 102 to drive hub 106. Drive hub 106 is coupled to brush core 108 in order to rotate brush core 108. The adjustable support arm, which includes first section 118 and second section 116 further provides lateral and angular adjustment. Lateral adjustment is provided by first section 118, which includes lateral adjustment screw 130 configured to move the adjustable support arm along track 134. Once the adjustable support arm is in a desired location, lockdown screw 132 secures the adjustable support arm in that location. First section 118 is coupled to second section 116 through pivot 128. One skilled in the art will appreciate that other suitable connections that provide for the angular adjustment besides pivot 128 may be provided. These connections would provide the ability for the angular adjustment as provided by pivot 128. Second section 116 also includes fluid delivery supply line 126.

Still referring to FIG. 2, fluid delivery supply line 126 is utilized to deliver fluid to be used in the cleaning process to a brush eventually disposed over brush core 108. Exemplary fluids include cleaning chemistries, aqueous solutions, foams, etc. Fluid delivery supply 126 delivers the fluid to brush core 108 into fluid plenum 121. From fluid plenum 121 defined within brush core 108, the fluid is delivered to a plurality of fluid delivery channels 124. The fluid delivery channels 124 are in flow communication with fluid delivery holes 122. That is, a fluid delivery channel 124 corresponds to a single fluid delivery hole 122. The fluid delivery holes 122 will then eventually be used to deliver fluid through a brush disposed over brush core 108 onto a surface of a substrate to be cleaned. In one embodiment, in order to guarantee a consistent flow rate delivered to a brush disposed over brush core 108, each of the fluid delivery channels 124 are successively larger. That is, the fluid delivery channels 124 at the end of brush core 108 corresponding to adjustable support arm 114 become successively larger traversing the brush core towards brush rotate arm housing 104.

In one embodiment, the diameter of the fluid delivery channels 124 of FIG. 2 is about 3/8" in diameter. By enlarging each diameter of the fluid delivery channels from one end to the other, it should be appreciated that the flow rate will be maintained consistent even though a pressure drop may be experienced from the fluid inlet into brush core 108 to the drive hub side of the brush core. Fluid delivery holes 122 are depicted as circular holes with regard to this embodiment, however, the fluid delivery holes may be any suitable shape, especially in light of the molding process. The thickness of the walls defined between consecutive fluid delivery holes 122 within the same row and between adjacent rows of fluid delivery holes is maintained substantially constant. In one embodiment, the diameter of the fluid delivery holes 122 is about 0.400" (inches). It should be appreciated that this substantially consistent thickness between each of the fluid delivery holes 122 assists the molding process by which brush core 108 may be created. As can be seen, the diameter of fluid delivery channels 124 is smaller than the diameter of fluid delivery holes 122. In addition, the wall thickness between the fluid delivery holes 122 is less than the diameter of the fluid delivery holes. In one embodiment, the wall thickness is about 0.078" (inches).

Figure 3:
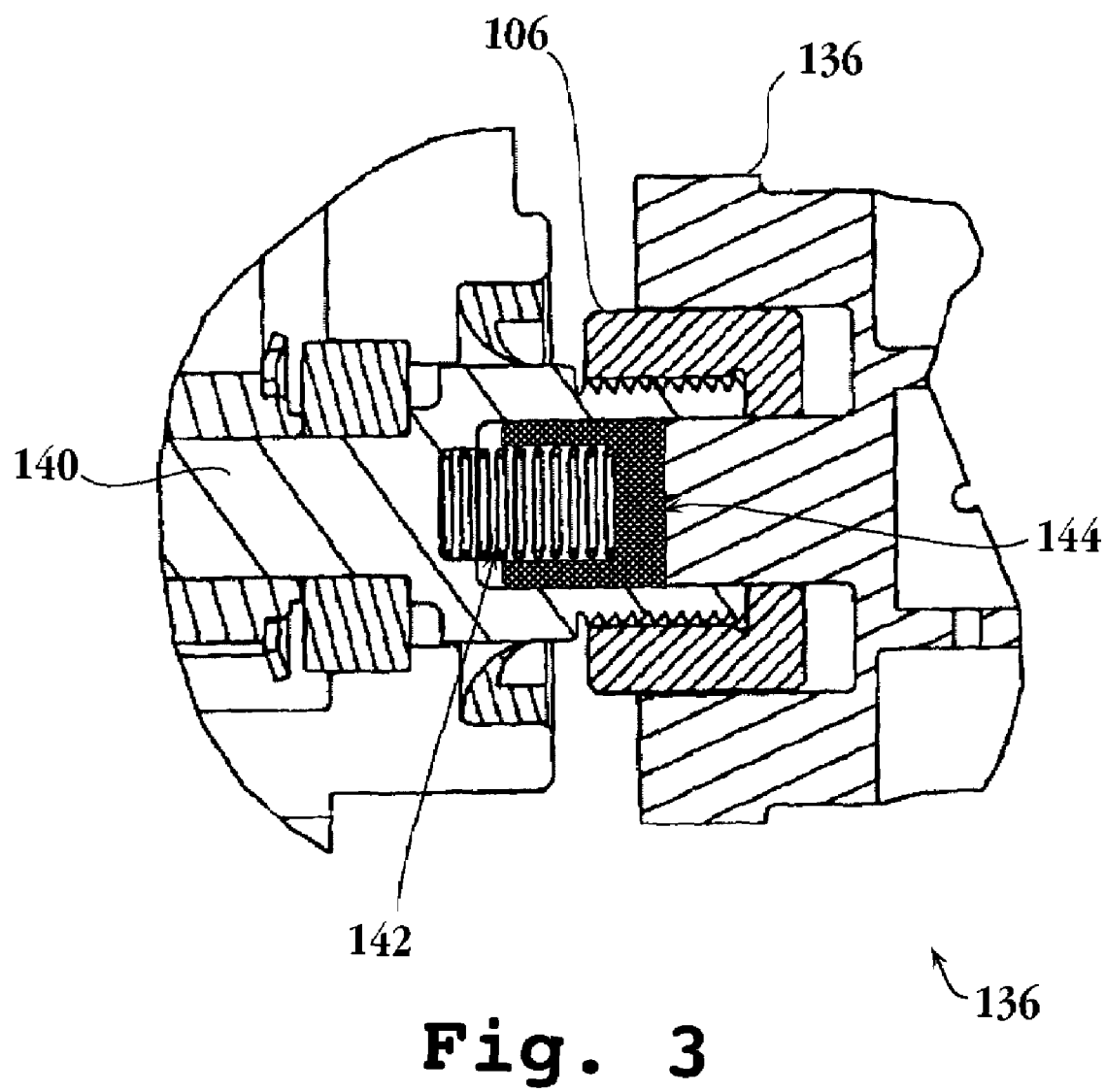
FIG. 3 is a simplified schematic diagram showing further details of the drive hub region coupling the brush arm rotate housing and the brush core in accordance with one embodiment of the invention.

FIG. 3 is a simplified schematic diagram showing further details of the drive hub region coupling the brush arm rotate housing and the brush core in accordance with one embodiment of the invention. Within region 136, brush core 108 is interlocked with brush arm rotate housing through drive hub 106. Brush rotate drive shaft 140, which is powered through the belt or chain translating the rotation of the main drive shaft, is coupled with spring 142, which is coupled to axial load plunger 144, which in turn is coupled with brush core 108. As mentioned above, drive hub 106 may be a square shape in order to efficiently translate the rotation and torque necessary to rotate brush core 108.

Figure 4:
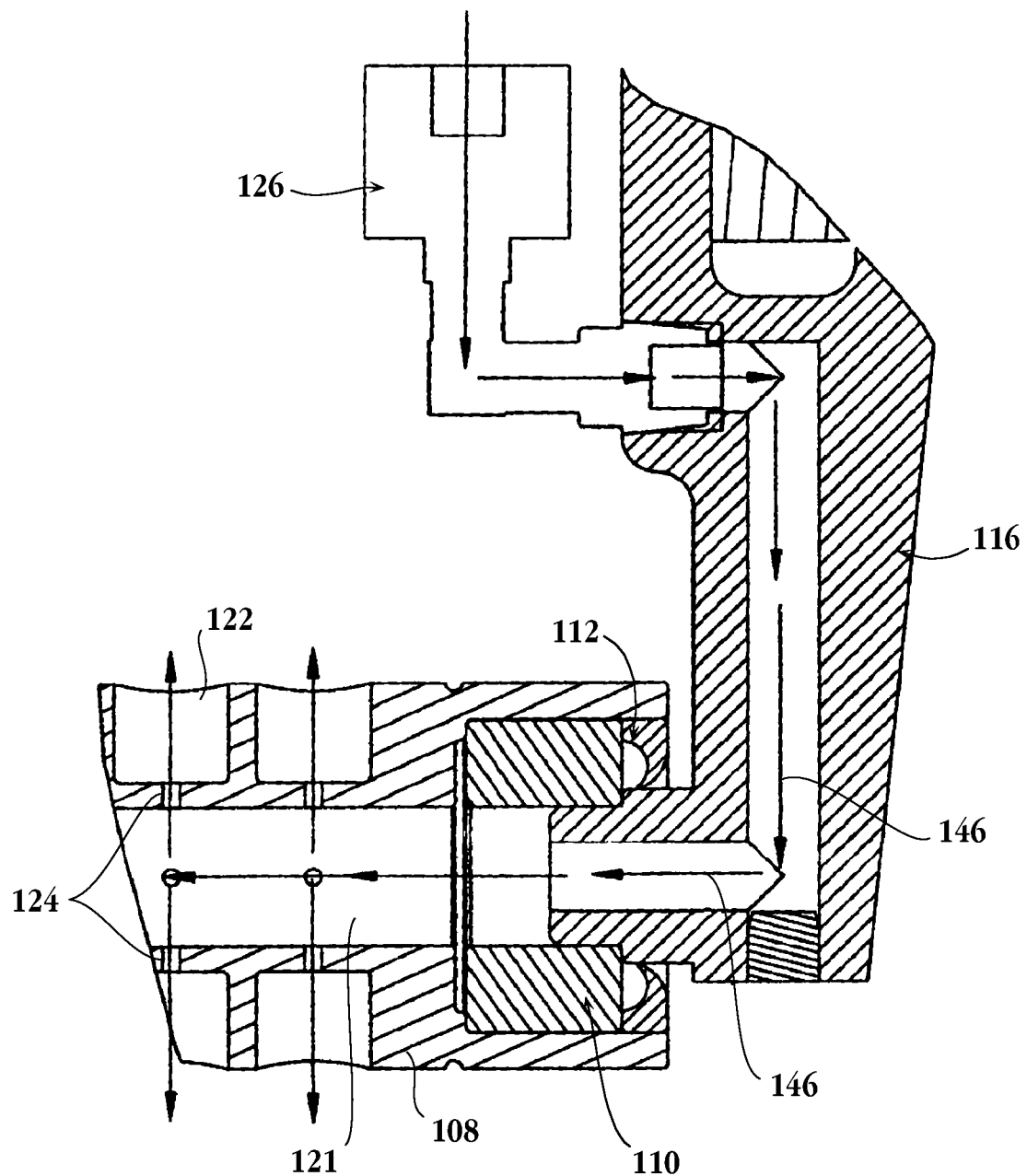
FIG. 4 is a simplified schematic diagram showing a cross section of the fluid delivery line into the brush core in accordance with one embodiment of the invention.

FIG. 4 is a simplified schematic diagram showing a cross section of the fluid delivery line into the brush core in accordance with one embodiment of the invention. Fluid delivery supply line 126 provides an inlet into second section 116 of the adjustable support arm. The chemistry path of cleaning fluid path is defined by arrows 146 into brush core 108. Bearing 110 and seal 112 are included to couple brush core 108 to the adjustable support arm. One skilled in the art will appreciate that numerous types of seals and bearings may be used in order to achieve the functionality as described herein. The fluid is delivered into fluid plenum 121 and thereafter through fluid channels 124 to corresponding fluid delivery holes 122. As mentioned above, a brush may be slideably mounted over brush core 108. In one embodiment, the brush is a poly vinyl alcohol brush. The brush is a porous brush, which will enable the fluid to pass through so that the fluid may be delivered to a surface of a substrate over which the brush is rotating in order to provide cleaning. In one embodiment, a diameter of the fluid delivery plenum is about 0.50" (inches).

Figure 5:
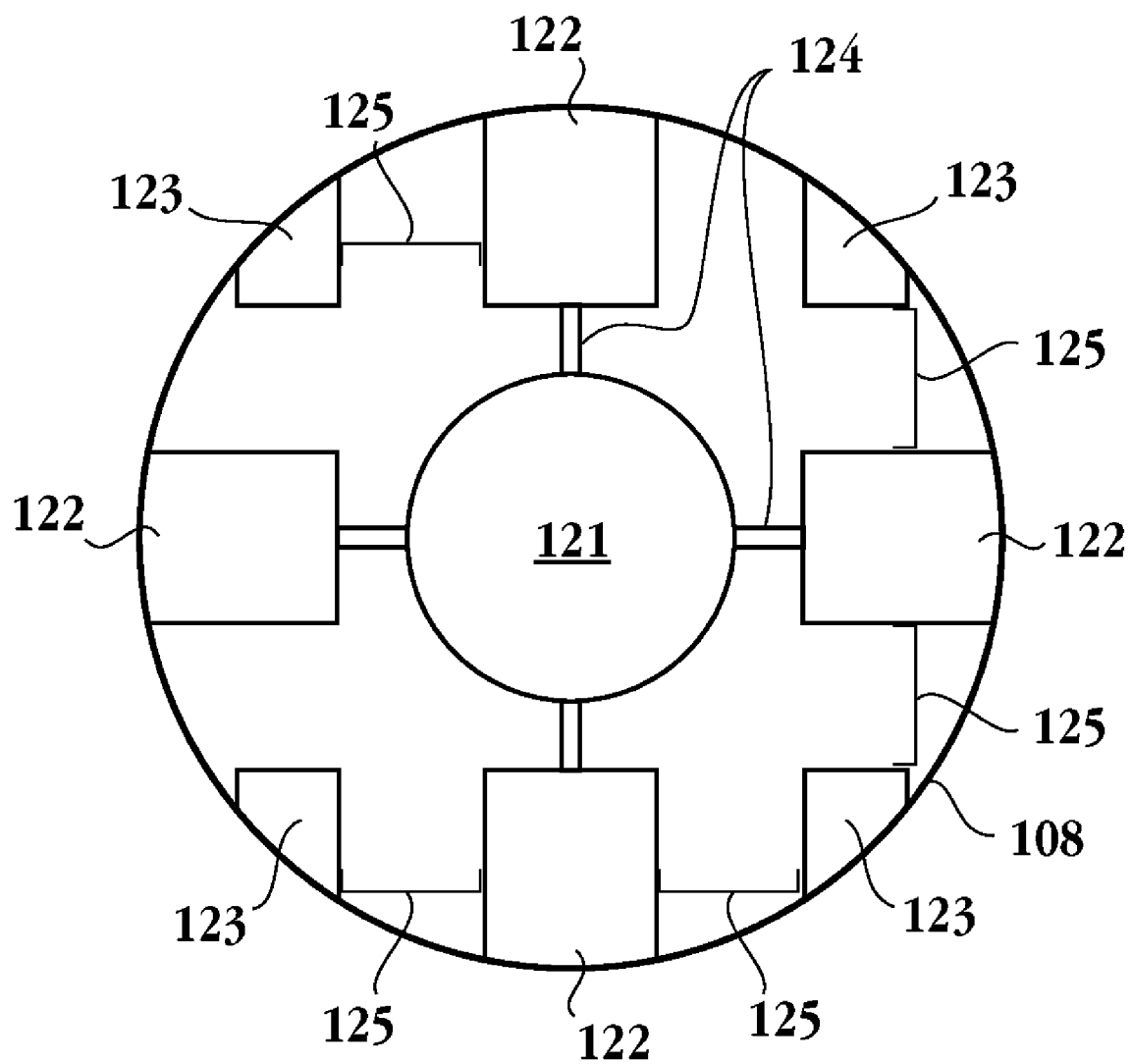
FIG. 5 is a simplified schematic illustrating a cross sectional view of the brush core in accordance with one embodiment of the invention.

FIG. 5 is a simplified schematic illustrating a cross sectional view of the brush core in accordance with one embodiment of the invention. Brush core 108 is an elongated cylinder having an inner cavity referred to as fluid plenum 121. Fluid delivery channels 124 provide paths for fluid from fluid plenum 121 to fluid delivery holes 122. As illustrated, fluid delivery holes 122 are cavities defined on the outer surface of brush core 108. In addition to fluid delivery holes 122 being defined on an outer surface of brush core 108, pockets 123 are also formed on the outer surface. One skilled in the art will appreciate that as brush core 108 may be created through a molded process, pockets 123 function to maintain the wall thickness 125 within the cross section substantially uniform.

In summary the embodiments described above define a moldable brush core optimized for maintaining a substantially constant fluid delivery through holes defined across the length of the brush core. In addition, pockets 123 remove unnecessary material, which is beneficial for the molding process. As illustrated, pockets 123 do not have fluid delivery capability, however, in an alternate embodiment, these pockets may have fluid delivery capability. In one embodiment, the fluid delivery channels successively have a larger diameter when progressing from an inlet side of the brush core in order to maintain a substantially constant flow rate across a substrate being cleaned.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A brush core assembly, comprising:
   a drive shaft configured to rotate about an axis;
   a first arm extension coupled to an end of the drive shaft;
   a second arm extension coupled to the drive shaft; and
   a brush core having a first end and a second end, the first end coupled to the first arm extension, the second end coupled to the second arm extension, the brush core having a fluid plenum defined inside the brush core, the fluid plenum configured to distribute fluid to a plurality of fluid channels, the plurality of fluid channels further configured to distribute the fluid to corresponding distribution holes, the corresponding distribution holes being configured so that a thickness of a solid portion of the brush core in between each of the corresponding distribution holes is substantially similar, wherein the first arm extension includes a drive mechanism that causes the brush core to rotate in response to rotation of the drive shaft.

2. The brush core assembly of claim 1, wherein the second arm extension is slideably mounted on the drive shaft so as to laterally adjust a distance between the second arm extension and the first arm extension.

3. The brush core assembly of claim 1, wherein the second arm extension includes a first section slidably coupled to the drive shaft and a second section having a first end and a second end, the first end of the second section pivotably coupled to the first section and a second end of the second section is coupled to the brush core.

4. The brush core assembly of claim 3, wherein the second section includes a fluid feed line connecting to the fluid plenum.

5. The brush core assembly of claim 1, wherein the brush core is a molded brush core.

6. The brush core assembly of claim 1, wherein a diameter of each of the plurality of fluid channels is less than a diameter of corresponding distribution holes.

7. The brush core assembly of claim 1, further comprising:
   a brush slidably mounted over an outer surface of the brush core.

8. The brush core assembly of claim 1, wherein a diameter of each of the plurality of fluid channels becomes successively larger when traversing the brush core from the second arm extension to the first arm extension.

9. The brush core assembly of claim 1, wherein the first arm extension is coupled to the brush core through a square drive hub.

10. A brush core for use in cleaning a substrate, comprising:
    an elongated cylinder having a first end and a second end, the first end configured to receive a drive hub, the second end configured to receive fluid into an inner cavity of the elongated cylinder, the inner cavity configured to distribute fluid to a plurality of fluid channels having a first diameter, the plurality of fluid channels further configured to distribute the fluid to corresponding distribution holes defined on an outer surface of the brush core, the distribution holes having a second diameter, the brush core further including a plurality of non-fluid distributing pockets defined on the outer surface, the corresponding distribution holes and plurality of non-fluid distributing pockets being configured so that a thickness of a solid portion of the brush core is substantially similar, and wherein the first diameter is less than the second diameter.

11. The brush core of claim 10, wherein the brush core is composed of a moldable material.

12. The brush core of claim 10, wherein the brush core is configured to have a porous brush slidably mounted thereover and wherein the fluid is distributed through the brush from the corresponding distribution holes.

13. The brush core of claim 10, wherein the thickness of the solid portion is lees than the second diameter.

14. The brush core of claim 10, wherein the first diameter becomes successively larger when traversing the brush core from the second end to the first end.

15. The brush core of claim 10, wherein the first end is configured to receive a square drive hub.

16. The brush core of claim 10, wherein the first diameter is about 0.375 inches.

17. The brush core of claim 10, wherein the second diameter is about 0.4 inches.

18. The brush core of claim 10, wherein the brush core is composed of material selected from a group of polymers consisting of polypropylene, Polyvinylidene Fluoride polyetheretherketone, polyethylene terephthalate, and Perfluoroalkoxyethylene.

* * * * *